United States Patent

[11] 3,576,449

[72] Inventor John B. Howell
Sparks, Md.
[21] Appl. No. 745,895
[22] Filed July 18, 1968
[45] Patented Apr. 27, 1971
[73] Assignee The Bendix Corporation

[54] AUDIO LEVEL CLIPPER AND COMPRESSOR
8 Claims, No Drawings

[52] U.S. Cl. .......... 307/237, 328/171, 330/29, 330/145, 333/14
[51] Int. Cl. .......... H03k 5/08
[50] Field of Search .......... 307/237; 328/168, 169, 171—175; 330/29, 144, 145; 333/14

[56] References Cited
UNITED STATES PATENTS

| | | | |
|---|---|---|---|
| 3,163,828 | 12/1964 | Fine | 330/29X |
| 3,397,324 | 8/1968 | Fine et al. | 330/29X |
| 3,441,748 | 4/1969 | Werner | 307/237 |

*Primary Examiner*—Donald D. Forrer
*Assistant Examiner*—John Zazworsky
*Attorney*—Plante, Arens, Hartz & O'Brien

ABSTRACT: An audio level clipper and compressor wherein the part of a signal that exceeds the clipping level serves to operate the compressor. An audio signal is applied to the base of a transistor which is forward biased by a fixed, positive DC voltage level. This transistor operates as an emitter follower with its emitter current flowing through a load resistor. A limiter transistor, also having a positive DC voltage level applied to its base, is also connected to supply emitter current to the load resistor. However, the emitter follower emitter voltage normally back-biases the limiter transistor. When the audio voltage is increased the emitter follower emitter voltage drops low enough to allow the limiter transistor to conduct, thus clamping the voltage across the load resistor to the limiter transistor base voltage. Resulting current flow through the limiter transistor is amplified and detected and applied to control a voltage variable resistor which serves to attenuate the audio input.

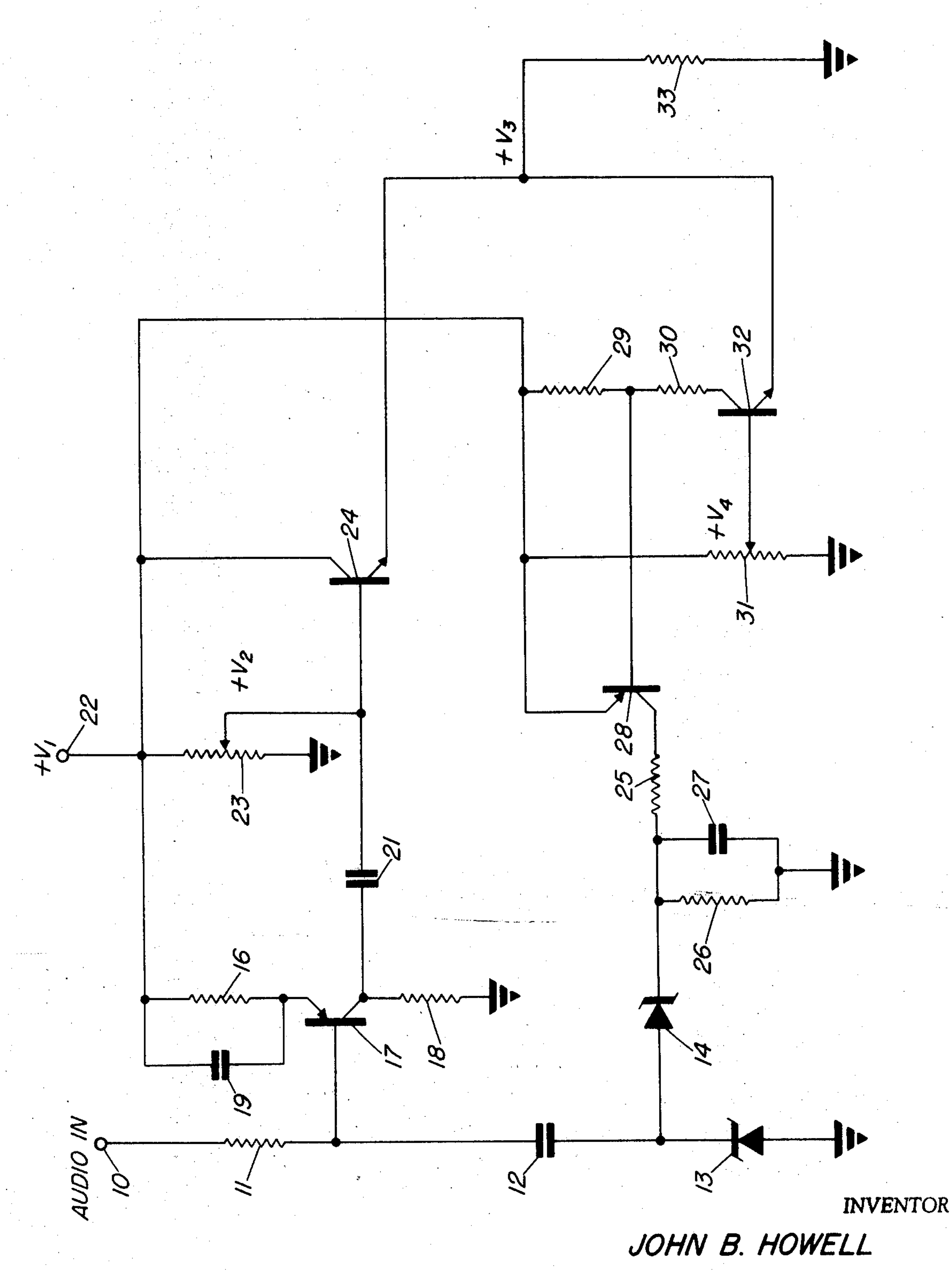
INVENTOR
JOHN B. HOWELL
BY William G. Christoforo
ATTORNEY

AUDIO LEVEL CLIPPER AND COMPRESSOR

BACKGROUND OF THE INVENTION

This invention relates to an audio level clipper and compressor and more particularly to an audio level clipper and compressor having a feedback circuit wherein that portion of the signal which is clipped is used to attenuate the audio input signal so as to compress the audio signal appearing at the output of the compressor.

Clipping normally involved the flattening off of a wave to some arbitrary level regardless of the amplitude of the original in excess of this clipping level. In audio modulation systems wherein it is required that modulation remain below 100 percent, base clipping of the audio signal is employed to prevent the audio signal from swinging below an arbitrary base line which would result in excessive modulation of a carrier wave with resultant broadening of the frequency spectrum.

Audio compression circuits are also used in amplitude modulation systems to limit audio levels to those levels which will produce less than 100 percent modulation. Audio compression is normally employed with audio amplifiers where it is desired to maintain the audio output constant regardless of the intensity of the audio input signal. A small portion of the amplifier output is sampled by a rectifier such that the DC output of the rectifier corresponds to an averaged intensity of the amplifier output. This rectified voltage is then applied as a negative feedback to the control terminals of the amplifier. Any change in the average amplitude of the output signal thus alters the bias of the amplifier and hence the amplification in a manner that tends to minimize changes in the amplifier output. Time constants in the rectifier output circuitry are made quite small so that the amplification will follow rapid fluctuations in the audio output intensity.

Clipping of an audio signal can be expected to decrease the fidelity of the signal somewhat since a portion of the signal is removed. However, audio clipping has the advantage of acting practically instantaneously so that modulation of the properly clipped signals can never exceed a maximum design value.

Audio compression systems are particularly advantageous when dealing with voice frequency currents in that the time constant of the electrical circuits in the rectifier output can be manipulated to determine the particular characteristics of the speech that control the output of the compressor circuit. Compressor circuits have the slight disadvantage, that even though the time constants can be made quite small, rapid changes in the audio input may drive the audio output to a level which will produce greater than 100 percent modulation. It can thus be seen that circuits having the advantages of both audio clipping and audio compression techniques are quite important in amplitude modulation systems.

BRIEF DESCRIPTION OF THE INVENTION

Accordingly, a new circuit has been devised which uses both audio clipping and audio compression techniques to maintain an audio output level constant regardless of the level of the audio input. An audio input signal is amplified and applied through an emitter follower to a load resistor. The audio output signal is base clipped by a limiting transistor to prevent the audio output signal from swinging to too low a magnitude. The clipped portion of the audio signal is detected with the detector DC output being applied to vary the resistance of a voltage variable resistor connected to attenuate the audio input signal.

It is thus an object of this invention to provide an audio level clipping and compression circuit wherein that portion of the audio signal being clipped is used to regulate an audio compressor.

It is another object of this invention to provide an audio circuit wherein the intensity of the audio output is maintained relatively constant regardless of the intensity of an audio input and having advantages of audio clipping and audio compression circuits.

It is still another object of this invention to provide an audio clipping and compression circuit in which the bias level of the audio output may be easily set and varied if desired.

It is a still further object of this invention to provide an audio clipping and compression circuit which not only maintains a relatively constant audio output level but also prevents the audio output level from swinging below a predetermined level.

BRIEF DESCRIPTION OF THE DRAWING

The only FIG. is a schematic of an audio level clipper and compressor illustrating an embodiment of the invention.

DESCRIPTION OF THE PREFERRED EMBODIMENT

Referring to the figure an audio input signal is applied to terminal 10 and resistively coupled through resistor 11 to the base of amplifier transistor 17, which together with resistors 16 and 18 and capacitor 19 comprise an audio amplifier. The amplified audio signal appearing on the collector of transistor 17 is capacitively coupled through capacitor 21 to the base of emitter follower transistor 24. The base of the emitter follower is biased by voltage source $+V_1$ impressed on terminal 22 and acting through voltage divider 23 so that the resulting voltage on the base of the emitter follower is $+V_2$. A baseline DC voltage, $+V_3$, is thus established on the emitter of the emitter follower 24, which is equal to $+V_2$ less the base-emitter drop of transistor 24. The amplified audio signal is impressed on this baseline voltage and applied across load resistor 33. A limiter transistor 32 having its emitter connected to the emitter of transistor 24 has a voltage $+V_4$ impressed on its base by the voltage divider 31 connected between voltage $+V_1$ and ground. Voltage $+V_3$ is designed to be greater than voltage $+V_4$ by the permissible negative voltage swing of the audio signal impressed across load resistor 33. It can thus be seen, that limiter transistor 32 is normally back-biased as long as the audio signal does not swing to its cutoff value which is $+V_4$ less the base-emitter drop of transistor 32. Whenever the audio output signal does fall below the cutoff value, the signal is base clipped with transistor 32 becoming conductive so its emitter is clamped at the cutoff DC voltage level. With transistor 32 conductive current flows in resistors 29 and 30 applying forward bias to rectifier and amplifying transistor 28. The voltage which is now impressed across capacitor 27, and hence across the voltage variable resistive circuit comprised of Zener diodes 13 and 14, is determined not only by the amount of forward bias on transistor 28 but also by the dynamic response of the time constant circuits comprised of resistors 25 and 26 and capacitor 27, the time constant circuits determining the rate at which the voltage across the voltage variable resistive circuit rises or falls in response to increased or decreased audio input signals respectively. The voltage variable resistor circuit, in combination with resistor 11, attenuates the incoming audio signal which is applied on terminal 10, in accordance with the voltage across capacitor 27. It should now be obvious that as long as the audio output signal tends to be clipped, the audio input signal will be attenuated, or in other words, compressed. The audio output signal will thus be maintained at its proper level.

Since capacitor 27 is a short circuit to audio frequencies, Zener diodes 13 and 14 both are effective to attenuate the audio input signals. Diodes 13 and 14 are suitably low voltage type Zener diodes whose characteristic curves show that their dynamic impedance decreases as the DC voltage across them increases.

The compressor attack time, which is the time required for the compressor to reduce the gain to its appropriate value after the initial onset of a large signal at the audio input, is determined by the time constant of the circuit comprised of capacitor 27 and resistor 25. The compressor decay time, which is the time required for the compressor to return to normal operation after a large signal at the audio input is decreased, is determined by the time constant of the circuit comprised of capacitor 27 and resistor 26.

For illustration only, and not by way of limitation, typical DC voltage levels as used in a practical circuit embodying the principles of this invention are listed below.

$V_1$=16 volts $V_2$=5.6 volts $V_3$=5 volts $V_4$=1.6 volts

It can be seen from the above table that the base audio clipping level is 1 volt. That is, the voltage impressed across load resistor 33 cannot drop below 1 volt and that any tendency of the voltage to drop below this level will cause the compressor circuitry to attenuate the audio input by an amount sufficient to maintain this level at 1 volt with the limitations imposed by the reaction times of the aforementioned time constant circuits.

Having described the preferred embodiment of my invention I hereby claim the subject matter including modifications and alterations thereof encompassed by the true scope and spirit of the appended claims.

I claim:

1. A circuit for clipping and compressing an audio signal comprising:
   - an audio input terminal upon which an audio input signal is impressed;
   - an output terminal;
   - means electrically coupling said input terminal to said output terminal including first means for biasing said output terminal at first predetermined DC voltage level, whereby said audio input signal is impressed at said output terminal and referenced to said first predetermined DC voltage level;
   - an electrical load connected to said output terminal;
   - a source of current;
   - unidirectional current flow means connected to deliver current from said source of current, when forward biased, to said output terminal, the signal on said output terminal normally back biasing said unidirectional current flow means and forward biasing said unidirectional current flow means when said signal on said output terminal is below a predetermined threshold;
   - means for sensing current flow through said unidirectional current flow means; and
   - voltage variable impedance means coupled to said input terminal and responsive to said current flow for attenuating said audio input signal on said input terminal.

2. An audio circuit as recited in claim 1 wherein said coupling means comprises:
   - a first source of DC voltage;
   - an emitter follower transistor having a base terminal connected to said first source of DC voltage and an emitter terminal connected to said output terminal; and
   - means capacitively coupling sad said audio input terminal to said base terminal.

3. An audio circuit as recited in claim 2 wherein said capacitively coupling means additionally comprises an audio amplifier for amplifying said audio input signal.

4. An audio circuit as recited in claim 3 wherein said unidirectional current flow means comprises:
   - a clipping transistor having an emitter terminal connected to said output terminal, a collector terminal connected to said sensing means and a base terminal; and
   - second biasing means for applying a bias to the base terminal of said clipping transistor.

5. An audio circuit as recited in claim 1 including a source of primary DC voltage and wherein said coupling and first biasing means comprises:
   - a first potentiometer connected across said primary voltage source and including a slider;
   - an emitter follower transistor having a collector-emitter circuit connected between said primary voltage source and said output terminal and having a base terminal connected to said first potentiometer slider and coupled to said input terminal; and wherein said unidirectional means comprises:
     - a resistance network having one end connected to said primary voltage source;
     - a clipping transistor having an emitter-collector circuit connected between another end of said resistance network and said output terminal; and
     - a second potentiometer connected across said primary voltage source and having a slider connected to a base terminal of said clipping transistor.

6. An audio circuit as recited in claim 5 and including time constant means through which said sensed current flows for generating a control voltage, said voltage variable impedance means being responsive to said control voltage for attenuating said audio input signal on said input terminal.

7. A circuit for clipping and compressing an audio signal comprising:
   - an audio input terminal upon which an audio signal is impressed;
   - an output terminal;
   - a source of DC voltage;
   - a first transistor having an emitter terminal connected to said output terminal, a collector terminal connected to said DC voltage source, and a base terminal connected to said input terminal;
   - means for maintaining the DC voltage level at said base terminal at a first predetermined level,
   - a second transistor having an emitter terminal connected to said output terminal, and base and collector terminals;
   - means for maintaining the DC voltage level at said second transistor base terminal at a second predetermined level;
   - means for sensing current flow therethrough connected between said second transistor collector terminal and said DC voltage source; and
   - voltage variable impedance means responsive to said sensed current for attenuating said audio input signal on said input terminal.

8. An audio circuit as recited in claim 7 with additionally time constant circuit means for controlling the dynamic response of said sensed current on said voltage variable impedance means.